United States Patent
Wang et al.

(10) Patent No.: US 10,536,765 B2
(45) Date of Patent: Jan. 14, 2020

(54) EARPHONE CASE

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Juan Wang, Shenzhen (CN); Jun-Liang Zhang, Shenzhen (CN); Tao Jiang, Shenzhen (CN); Tai-Shan Zhu, Shenzhen (CN); Chien-Chih Kuo, New Taipei (TW)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 206 days.

(21) Appl. No.: 15/696,280

(22) Filed: Sep. 6, 2017

(65) Prior Publication Data
US 2019/0020941 A1 Jan. 17, 2019

(30) Foreign Application Priority Data
Jul. 11, 2017 (CN) .......................... 2017 1 0562480

(51) Int. Cl.
*H04R 1/10* (2006.01)
*B65D 85/672* (2006.01)
(Continued)

(52) U.S. Cl.
CPC ......... *H04R 1/1033* (2013.01); *B65D 85/672* (2013.01); *B65H 75/08* (2013.01); *B65H 75/4471* (2013.01); *B65H 75/4481* (2013.01); *B65H 75/4486* (2013.01); *A45C 11/00* (2013.01); *B65H 2701/3919* (2013.01); *H04R 1/1016* (2013.01); *H04R 1/1091* (2013.01); *H05K 5/0217* (2013.01)

(58) Field of Classification Search
CPC ...... B65H 2701/3919; B65H 2701/536; B65H 75/4471; B65H 75/4486; B65H 75/4431; B65H 75/08; B65H 75/38; B65H 75/406; B65H 75/4428; B65H 75/02; B65H 75/28; B65H 75/285; B65H 75/4468; B65H 75/75; B65H 75/4407; B65H 75/4457; B65H 49/08; B65H 49/18; B65H 49/205; B65H 49/322; B65H 18/10; A45C 11/00; A45C 2011/001; H04R 1/1033; H04R 1/10; H04R 1/1008; H04R 1/1016; B65D 85/672
See application file for complete search history.

(56) References Cited

U.S. PATENT DOCUMENTS 5,422,957 A * 6/1995 Cummins .......... B65H 75/4431
381/384
8,811,646 B1 * 8/2014 Romeo ................ H04R 1/1033
381/370

(Continued)

*Primary Examiner* — Michael R Mansen
*Assistant Examiner* — Raveen J Dias
(74) *Attorney, Agent, or Firm* — ScienBiziP, P.C.

(57) ABSTRACT

An earphone case includes a shell, a rotating drum received in the shell, a driving assembly coupled to the rotating drum and configured for rotating the rotating drum, and a back cover latchable with the shell and receiving the driving assembly in a receiving space defined therein. The rotating drum is driven by the driving assembly to rotate to wind a wire of at least one pair of earphones.

9 Claims, 6 Drawing Sheets

(51) Int. Cl.
  *B65H 75/44* (2006.01)
  *B65H 75/08* (2006.01)
  *A45C 11/00* (2006.01)
  *H05K 5/02* (2006.01)

(56) References Cited

U.S. PATENT DOCUMENTS

| | | | | |
|---|---|---|---|---|
| 2004/0200920 A1* | 10/2004 | Wei | B65H 75/4434 | 242/378.4 |
| 2006/0006038 A1* | 1/2006 | Beverlin | B65H 75/406 | 191/12.2 R |
| 2007/0251786 A1* | 11/2007 | Wegner | B65H 75/28 | 191/12.2 R |
| 2008/0245919 A1* | 10/2008 | Peng | B65H 75/04 | 242/407 |
| 2009/0184190 A1* | 7/2009 | Lin | B65H 75/4434 | 242/405 |
| 2013/0083456 A1* | 4/2013 | Koenig | H04R 1/1033 | 361/679.01 |
| 2013/0153701 A1* | 6/2013 | Huang | B65H 75/4434 | 242/385.2 |
| 2013/0163219 A1* | 6/2013 | Chen | B65H 75/4481 | 361/807 |
| 2013/0168486 A1* | 7/2013 | Abfall | H04R 1/1033 | 242/588.3 |
| 2013/0221145 A1* | 8/2013 | Reynolds | B65H 75/143 | 242/125.2 |
| 2013/0315432 A1* | 11/2013 | Chen | H04R 1/1033 | 381/384 |
| 2014/0048443 A1* | 2/2014 | Steinmueller | H04R 1/1033 | 206/701 |
| 2015/0014471 A1* | 1/2015 | Omodei | B65D 85/04 | 242/580 |
| 2015/0312667 A1* | 10/2015 | Lei | H04R 1/1033 | 242/379 |
| 2016/0332842 A1* | 11/2016 | Hanson | B65H 75/406 | |
| 2016/0337740 A1* | 11/2016 | Chu | H04R 1/1033 | |
| 2017/0013343 A1* | 1/2017 | Tomlinson | B65H 75/4431 | |
| 2017/0210591 A1* | 7/2017 | Kennedy | B65H 75/4473 | |
| 2018/0003740 A1* | 1/2018 | Chien | B65H 75/406 | |
| 2019/0141431 A1* | 5/2019 | Putnam, Jr. | H04R 1/1033 | |

* cited by examiner

EARPHONE CASE

CROSS-REFERENCE TO RELATED APPLICATIONS

This application claims priority to Chinese Patent Application No. 201710562480.4 filed on Jul. 11, 2017, the contents of which are incorporated by reference herein.

FIELD

The subject matter herein generally relates to an earphone case, and more particularly relates to an earphone case for storing earphones without tangling the wires.

BACKGROUND

Earphones are ubiquitous for use with portable electronic devices. Tangled wires are a common nuisance when the earphones are not being used.

BRIEF DESCRIPTION OF THE DRAWINGS

Implementations of the present technology will now be described, by way of example only, with reference to the attached figures.

DETAILED DESCRIPTION

Figure 1:
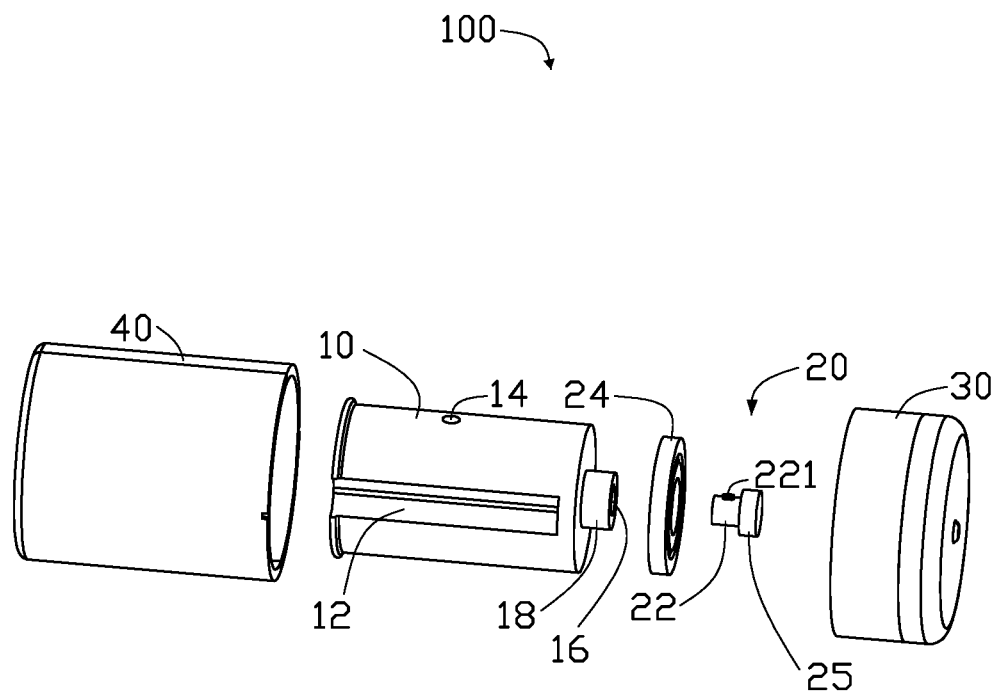
FIG. 1 is an exploded, isometric view of an embodiment of an earphone case.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected.

FIG. 1 illustrates an embodiment of an earphone case 100. The earphone case 100 can include a rotating drum 10, a driving assembly 20, a back cover 30, and a shell 40.

The rotating drum 10 can define a securing groove 12, an accommodating hole 14, and a shaft hole 16. The securing groove 12 can be defined along a lateral surface of the rotating drum 10. The accommodating hole 14 can be defined extending from an outer surface of the rotating drum 10 toward an interior of the rotating drum 10. The rotating drum 10 can include a shaft 18 extending from an end surface of the rotating drum 10 toward the back cover 30. The shaft hole 16 can be defined through the shaft 18.

Figure 2:
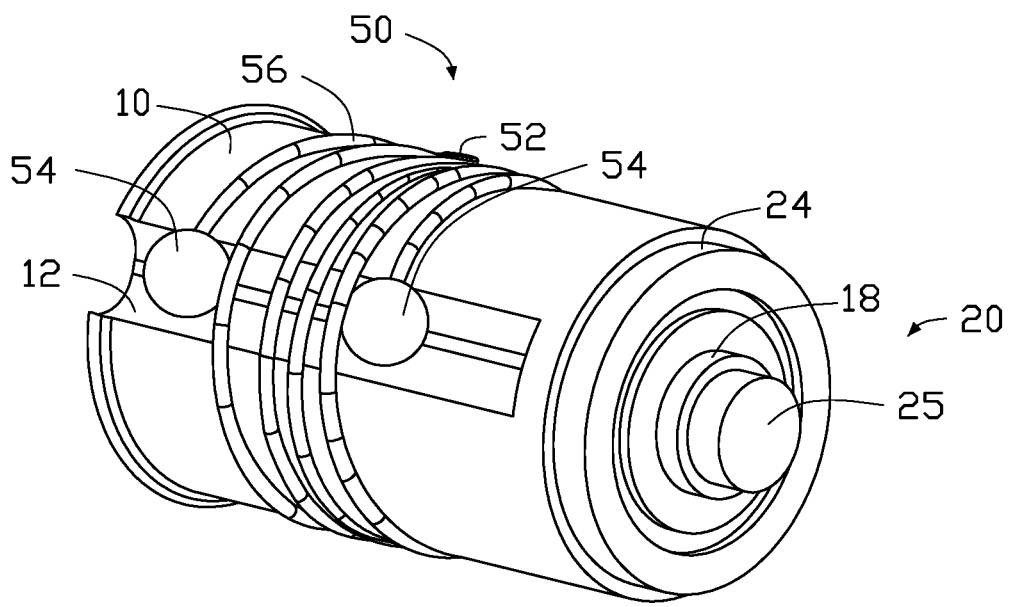
FIG. 2 is an isometric view of a rotating drum, a driving assembly, and a pair of earphones wound around the rotating drum.
Figure 3:
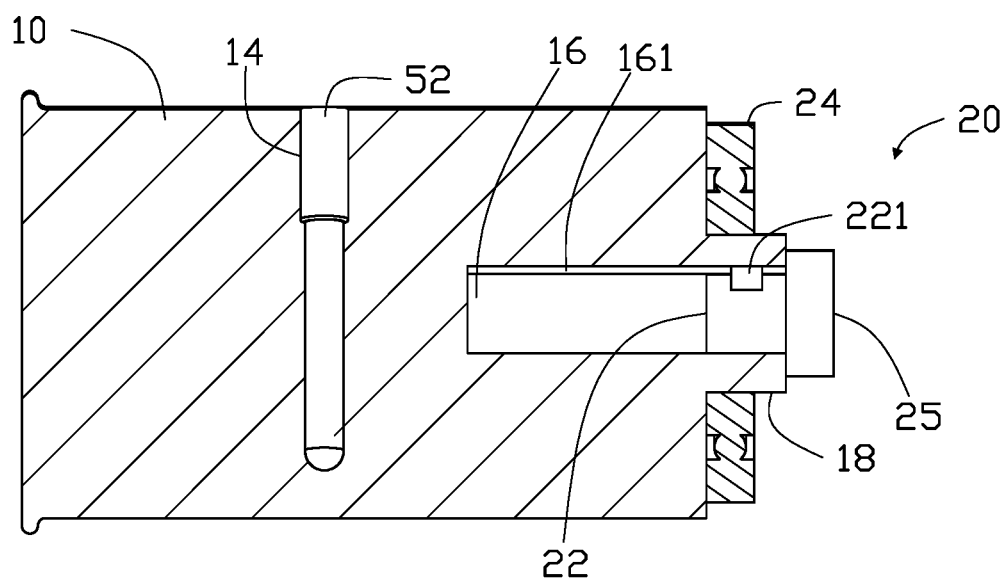
FIG. 3 is a cross-sectional view of the rotating drum and the driving assembly.

The driving assembly 20 can be received in the back cover 30. The driving assembly 20 can include a driving arm 22 and a bearing 24. The driving arm 22 can be coupled to the rotating drum 10. The shell 40 can receive the rotating drum 10 therein and be latched with the back cover 30. In at least one embodiment, the rotating drum 10 is cylindrical. The rotating drum 10 is for holding at least one pair of earphones 50 (shown in FIG. 2). The earphones 50 can include an earphone plug 52, earbuds 54, and a wires 56. The earphone plug 52 can be received in the accommodating hole 14. The earbuds 54 can be received in the securing groove 12. The wires 56 can be wound around the rotating drum 10. The rotating drum 10 can be rotated by the driving assembly 20. The driving assembly 20 can by coupled to the rotating drum 10 by the bearing 24. When the driving assembly 20 drives the rotating drum 10 to rotate, the earphone plug 52 can be first inserted into the accommodating hole 14. Then, rotation of the rotating drum 10 can wind the wires 56 around the rotating drum 10 (as shown in FIG. 3). After the wires 56 are wound around the rotating drum 10, the earbuds 54 can be received in the securing groove 12.

Referring to FIG. 3, the driving arm 22 can be received in the shaft hole 16. A driving groove 161 can be defined in an inner surface of the shaft hole 16. The driving groove 161 can be substantially parallel to a rotation axis (not shown) of the rotating drum 10. The driving arm 22 can include a protruding portion 221. The protruding portion 221 can be embedded in the driving groove 161, thereby rotationally coupling the rotating drum 10 to the driving assembly 20.

Figure 4:
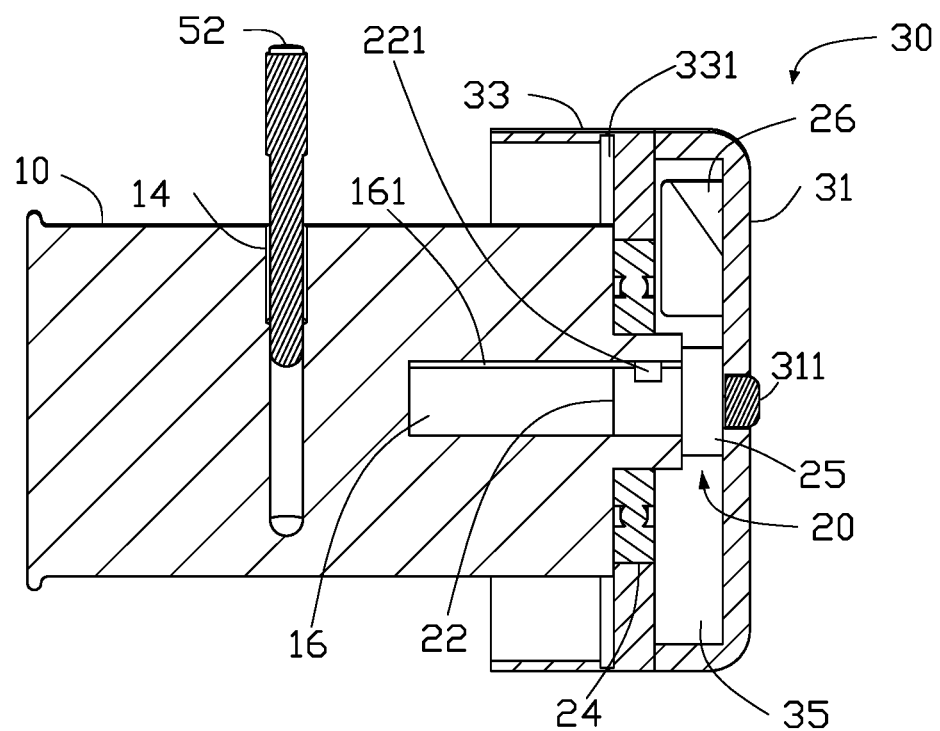
FIG. 4 is a cross-sectional view of the rotating drum, the driving assembly, and a back cover.

Referring to FIG. 4, the driving assembly 20 is coupled to the rotating drum 10, and the driving assembly 20 is received in the back cover 30. The back cover 30 can include a closed end 31 and an open end 33 opposite to the closed end 31. The closed end 31 can include a switch 311. The switch 311 can turn on the driving assembly 20 by driving the driving arm 22 to rotate the rotating drum 10. A receiving space 35 is defined in the closed end 31 for receiving the driving assembly 20. The open end 33 can latch with the shell 40. In at least one embodiment, the driving assembly 20 is arranged in the receiving space 35 by the bearing 24. The driving assembly 20 can include a motor 25 and a power source 26 received in the receiving space 35. The switch 311 can control the power source 26 to power the motor 25, and the motor 25 can drive the driving arm 22.

Figure 5:
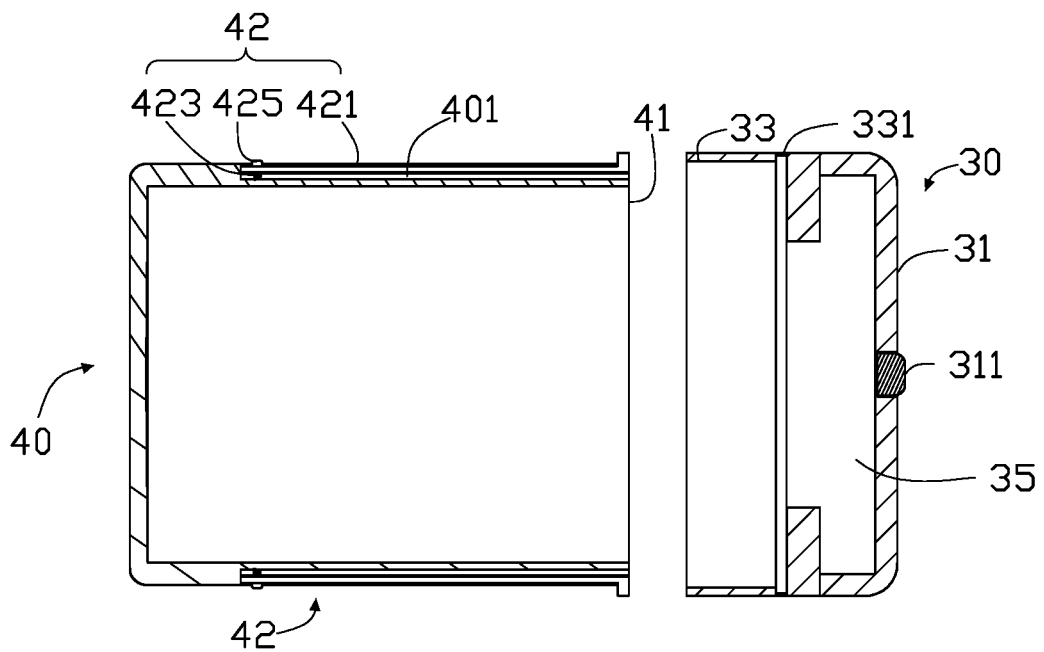
FIG. 5 is a cross-sectional view of a shell and the back cover.

Referring to FIG. 5, the shell 40 is latched with the open end 33 of the back cover 30. The shell 40 can include a latching assembly 42 arranged on an outer surface of the shell 40. The latching assembly 42 can latch the shell 40 to the back cover 30. In at least one embodiment, the shell 40 is cylindrical and includes an opening 41. An inner diameter of the opening 41 is larger than an outer diameter of the rotating drum 10. When the rotating drum 10 is received inside the shell 40, an accommodation space 60 is defined between the rotating drum 10 and the shell 40. The accommodation space 60 provides space for the wound earphones 50 (shown in FIG. 6). The latching assembly 42 is arranged on each of opposite sides of the shell 40. The latching assembly 42 can include a latching member 421 and an elastic member 423. An inner surface of the open end 33 of the back cover 30 can define a latching hole 331. A latching groove 401 can be defined in the outer surface of the shell 40. The latching groove 401 can extend from the opening 41 toward an end of the shell 40 opposite to the opening 41. The elastic member 423 and the latching member 421 are received in the latching groove 401. The elastic member 423 is compressed by the latching member 421, and the latching member 421 is resilient. The latching member 421 can latch in the latching hole 331 to latch the shell 40 to the back cover 30. The compression of the elastic member 423 causes the latching member 421 to form an outward projection 425. The outward projection 425 can be pressed to unlatch the shell 40 from the back cover 30.

Figure 6:
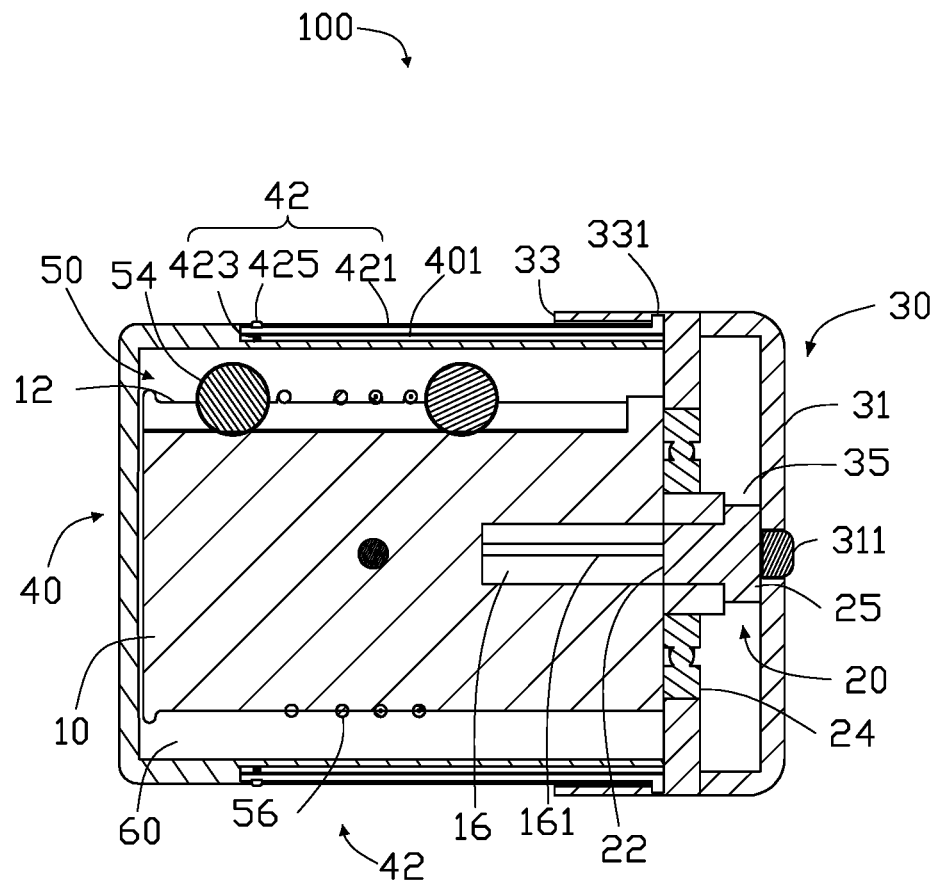
FIG. 6 is a cross-sectional view of the assembled earphone case with the earphones wound around the rotating drum.

Referring to FIG. 6, when the shell 40 is not yet latched with the back cover 30, the earphone plug 52 can first be inserted into the accommodating hole 14, and then the switch 311 can be operated to drive the driving assembly 20 to rotate the rotating drum 10. The rotating drum 10 is rotated to wind the wires 56. After the wires 56 are wound, the earbuds 54 can be received in the securing groove 12. Then, the shell 40 can be latched easily with the back cover 30, and the earphones 50 can be received in the accommodation space 60.

When the earphones 50 need to be used, the outward projections 425 can be pressed to cause the latching members 421 to release from the latching holes 331, and then the shell 40 can be easily removed from the back cover 30. Then, the switch 311 can be operated to rotate the rotating drum 10 in an opposite direction to unwind the earphones 50. Alternatively, the earphones 50 can be unwound manually.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An earphone case comprising:
   a shell;
   a rotating drum comprising a shaft extending from an end surface of the rotating drum, a shaft hole defined in the shaft, the rotating drum received in the shell;
   a driving assembly coupled to the rotating drum; and
   a back cover latchable with the shell and receiving the driving assembly in a receiving space defined therein;
   wherein a securing groove is defined on a lateral surface of the rotating drum for receiving a pair of earbuds of an earphone;
   wherein an accommodating hole is defined extending from an outer surface of the rotating drum toward an interior of the rotating drum for receiving an earphone plug of the earphone; and
   wherein the driving assembly comprises a driving arm received in the shaft hole to be coupled with the rotating drum, and the rotating drum is rotatable by the driving arm to wind a wire of the earphone around the rotating drum.

2. The earphone case of claim 1, wherein the driving assembly comprises a bearing surrounding the shaft.

3. The earphone case of claim 2, wherein a driving groove is defined in an inner wall of the shaft hole; the driving arm comprises a protruding portion; the protruding portion is embedded in the driving groove to couple the shaft to the driving assembly.

4. The earphone case of claim 3, wherein the driving assembly comprises a motor and a power source; the motor and the power source are received in the receiving space of the back cover; the back cover comprises a switch, the switch controls the power source to provide power to the motor to drive and rotate the rotating drum.

5. The earphone case of claim 4, wherein the back cover comprises a closed end and an open end; the switch is arranged on the closed end; the open end is opposite to the closed end and coupled to the shell.

6. The earphone case of claim 5, wherein the shell comprises a latching assembly; the latching assembly is arranged on an outer surface of the shell and latches with the open end of the back cover to latch the shell to the back cover.

7. The earphone case of claim 6, wherein the shell comprises an opening; an inner periphery of the opening is larger than an outer periphery of the rotating drum; an accommodation space is defined between the outer periphery of the rotating drum and the inner periphery of the opening when the rotating drum is received in the shell; the accommodation space accommodates the wound earphones therein.

8. The earphone case of claim 7, wherein the latching assembly is located on each of opposite sides of the shell; the latching assembly comprises a latching member and a resilient member; a latching hole is defined in the open end of the back cover; the latching member is latched in the latching hole to latch the shell to the back cover.

9. The earphone case of claim 8, wherein a latching groove is defined in each of opposite sides of the shell, the latching groove extends from the opening of the shell toward an end of the shell opposite to the opening; the latching member and the resilient member are received in the corresponding latching groove; the resilient member is compressed by the latching member when the shell is latched with the back cover; the latching member resisted by the resilient member forms an outward protrusion; the outward protrusion is pressed to unlatch the shell from the back cover.

* * * * *